US006606263B1

(12) United States Patent
Tang

(10) Patent No.: US 6,606,263 B1
(45) Date of Patent: Aug. 12, 2003

(54) NON-DISTURBING PROGRAMMING SCHEME FOR MAGNETIC RAM

(75) Inventor: Denny Tang, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/126,383

(22) Filed: Apr. 19, 2002

(51) Int. Cl.$^7$ .............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS

| | | | |
|---|---|---|---|
| 6,097,623 A | 8/2000 | Sakata et al. ................. 365/145 |
| 6,097,625 A | * 8/2000 | Scheuerlein .................. 365/171 |
| 6,180,444 B1 | 1/2001 | Gates et al. .................. 438/237 |
| 6,269,018 B1 | 7/2001 | Monsma et al. ............. 365/145 |
| 6,272,040 B1 | 8/2001 | Salter et al. .................. 365/158 |
| 6,272,041 B1 | 8/2001 | Naji ............................. 365/171 |
| 6,331,943 B1 | * 12/2001 | Naji et al. .................... 365/171 |
| 6,359,805 B1 | * 3/2002 | Hidaka ......................... 365/171 |
| 6,392,924 B1 | * 5/2002 | Liu et al. ...................... 365/171 |

OTHER PUBLICATIONS

"Spin–Valve RAM Cell", D. D. Tang, et al., IEEE Trans. on Magnetics, vol. 31, No. 6, Nov. 1995, pp. 3206–3208.
"Recent Developments in Magnetic Tunnel Junction MRAM", S. Tehrani et al., IEEE Trans. on Magnetics, vol. 36, No. 5, Sep. 2000, pp. 2752–2757.

* cited by examiner

Primary Examiner—Trong Phan
(74) Attorney, Agent, or Firm—George O. Saile; Stephen B. Ackerman

(57) ABSTRACT

In magnetic RAMs a particular memory cell is selected when it is at the intersection of a row and a column of half-selected cells. When data is written into the selected cell, the associated magnetic field can sometimes disturb a neighboring half-selected cell. This restricts the current range available for programming cells. The present invention solves this problem by using two bit lines. One end of the memory cell is connected to a first bit line, in a similar manner to the prior art. However, the programming line does not extend across the full width of the array, being instead connected to a second bit line immediately after it has passed directly across the memory cell. Orthogonal to the two bit lines is a word line whose role is to activate/deactivate transistors associated with the selected cell. Both 1T1R and 2T1R versions of the invention are described.

30 Claims, 6 Drawing Sheets

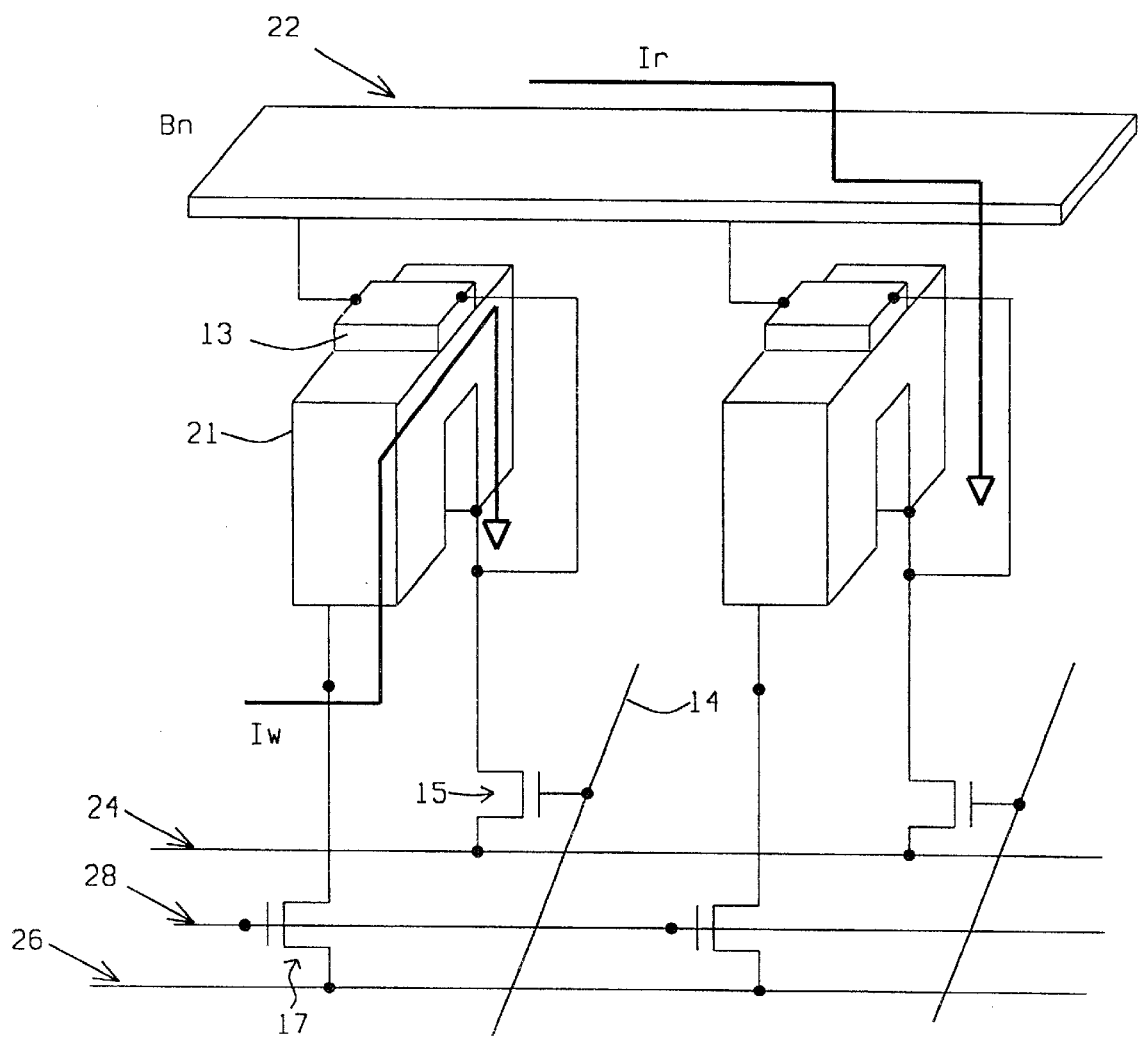
FIG. 5b
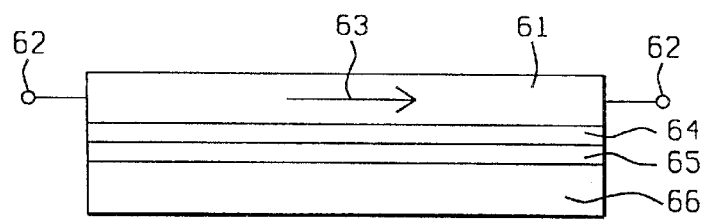
FIG. 6 – Prior Art

NON-DISTURBING PROGRAMMING SCHEME FOR MAGNETIC RAM

FIELD OF THE INVENTION

The invention relates to the general field of magnetic random access memory with particular reference to magneto-resistance (MR) based devices, including both Giant magneto-resistance type (GMR) and tunnel magneto-resistance type (TMR) devices.

BACKGROUND OF THE INVENTION

The principle governing the operation of the memory cells in magnetic RAMs is the change of resistivity of certain materials in the presence of a magnetic field (magneto-resistance). Magneto-resistance can be significantly increased by means of a structure known as a spin valve. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve can be seen in FIG. 6 which shows an example of a memory element. Seen are low coercivity (free) ferromagnetic layer 61, non-magnetic spacer layer 64, and a high coercivity ferromagnetic layer. The latter is usually formed out of soft ferromagnetic layer 65 that is pinned magnetically by an associated antiferromagnetic layer 66. When the free layer is exposed to an external magnetic field, the direction of its magnetization 63 is free to rotate according to the direction of the external field. After the external field is removed, the magnetization of the free layer will stay at a direction, which is dictated by the minimum energy state, determined by the crystalline and shape anisotropy, coupling field and demagnetization field. If the magnetization direction of the pinned layer is parallel to the free layer, electrons passing between the free and pinned layers, suffer less scattering. Thus, the resistance at this state is lower, when current flows along the film plain between terminals 62. If, however, the magnetization of the pinned layer is anti-parallel to the free layer, electrons passing from one layer into the other will suffer more scattering so the resistance of the structure will increase. The change in resistance of spin valve is typically 8–15%.

The simple sandwich structure of ferromagnetic layer-thin conductor-ferromagnetic layer can be used as memory element. In this structure, there is no anti-ferromagnetic layer, thus, neither of the two ferromagnetic layers is pinned. This kind of memory cell is called pseudo-spin valve memory cell. Both are free to switch magnetization under external field. One of the ferromagnetic layers is thicker than the other, the thicker one switches magnetization direction at a higher external magnetic field.

Of more recent vintage is the magnetic tunneling junction (MTJ) in which the layer that separates the free and pinned layers is a non-magnetic insulator, such as alumina or silica. Its thickness needs to be such that it will transmit a significant tunneling current. The principle governing the operation of the MTJ cell in magnetic RAMs is the change of resistivity of the tunnel junction between two ferromagnetic layers. When the magnetization of the two ferromagnetic layers is in opposite directions, the tunneling resistance increases due to a reduction in the tunneling probability. The change of resistance is typically 40%, which is much larger than for GMR devices. This phenomenon is called tunnel magneto-resistance effect, or TMR.

In a conventional 1T1R (1 transistor, 1 resistor), R can be the spin valve stripe or the tunnel diode of the MTJ device) magnetic RAM cells are programmed using two programming currents flowing through two orthogonal lines. This is illustrated in FIG. 1 where programming lines 11 and bit lines 12 intersect above memory cell 13 (the offset seen for lines 12 is for purposes of making the drawing clearer). The applied magnetic field is in the longitudinal direction of the cell, due to lines 11, which is usually the magnetic anisotropy axis, but is below the switching threshold of the cells. Thus, the longitudinal field alone does not switch the cells. The transverse field generated by lines 12 lowers the switching threshold of the longitudinal field so that a cell that lies at the intersection of two orthogonal activated lines can switch, while half-selected cells on same bit or programming line do not.

One weakness of this programming scheme is that the workable programming current values are bounded by a window, which is determined by the tolerance of the switching field of the cell array. When the spread of the threshold of cells in the array is large enough, half-selected cells will be disturbed. There is thus a need for an approach in which the programming magnetic field can be applied to only one cell without half-selecting other cells within the array.

Once a cell has been magnetized in a given direction, representing a zero or a one, it can be interrogated by applying voltage to one of the word lines 14 together with one of the bit lines 12. While all the FETs (such as 15) whose gates connect to the selected word line 14 will be activated, only the one that connects to selected bit line 12 will send current through memory element 13. Due to the MR effect, the measured resistance of 13 will correlate with its direction of magnetization.

A routine search of the prior art was performed with the following references of interest being found:

In U.S. Pat. No. 6,272,040 B1, Salter et al. show a method for programming a MR memory device while Naji discloses a MTJ MRAM parallel architecture in U.S. Pat. No. 6,272,041 B1. A ferroelectric memory device is described by Skata et al. in U.S. Pat. No. 6,097,623. U.S. Pat. No. 6,269,018 B1 (Monsma et al.) shows a MRAM using current through a MTJ write mechanism and in U.S. Pat. No. 6,180,444 B1, Gates et al. disclose a MJT memory device. The following publications are also noted:

(1) "Spin-valve RAM cell," by D. D. Tang, et al, IEEE Trans. on Magn., vol. 31, p3206, 1995.

(2) "Recent developments in magnetic tunnel junction MRAM," Tehrani, S. et, al., IEEE Trans. on Magn., vol. 36, Issue: 5 Part: 1, p.2752, September 2000.

SUMMARY OF THE INVENTION

It has been an object of at least one embodiment of the present invention to provide a MR based magnetic RAM that is free of the disturb problem that can occur in neighboring half-selected cells.

Another object of at least one embodiment of the present invention has been that said RAM permit a strong write current to ensure that cells do not show minor loop behavior.

Still another object of at least one embodiment of the present invention has been that the programming wires used in said RAM be in direct contact with the memory cells making up said RAM, thereby minimizing the current required during data writing.

A further object of at least one embodiment of the present invention has been to provide a method for writing information into and reading information from said RAM.

These objects have been achieved by using two bit lines instead of the single bit line seen in the prior art. One end of the memory cell is connected to a first bit line, in a similar manner to the prior art. The programming line does not extend across the full width of the array, being instead connected to a second bit line after passing directly across a memory cell. Orthogonal to the two bit lines is a word line whose role is to activate/deactivate transistors associated with the selected cell. Both 1T1R and 2T1R versions of the invention are described. The invention is applicable to both pseudo spin valves and magnetic tunneling junctions.

BRIEF DESCRIPTION OF THE DRAWINGS

FIGS. 5a and 5b are 3D representations of the schematic shown in FIG. 4 for MTJ and spin valve cells, respectively.

FIG. 6 is a schematic cross-section of a memory element spin valve.

DESCRIPTION OF THE PREFERRED EMBODIMENTS

The present invention describes a cell that is programmed by a single line whose length is not much greater than the memory cells maximum dimension. Since the magnitude of the magnetic field decreases rapidly with distance, neighboring cells experience little magnetic disturbance from this line. Thus, this programming scheme allows large tolerance in the switching threshold and solves the disturb problem in nearby half-selected cells.

Also, a much wider tolerance of MTJ characteristics can be used for cells. In addition, a very strong write current can be applied to ensure that the cell does not show minor loop behavior, which degrades cell performance such as a gradual change of switching threshold, and the resistance ratio of the two states after many half-select disturbs. Unlike conventional cells, in which the program line is away from the magnetic tunnel junction in a MTJ device, the program wire of the cell disclosed in the present invention is in direct contact with the MTJ device, thereby minimizing the current needed to generate the switching field.

Figure 2:
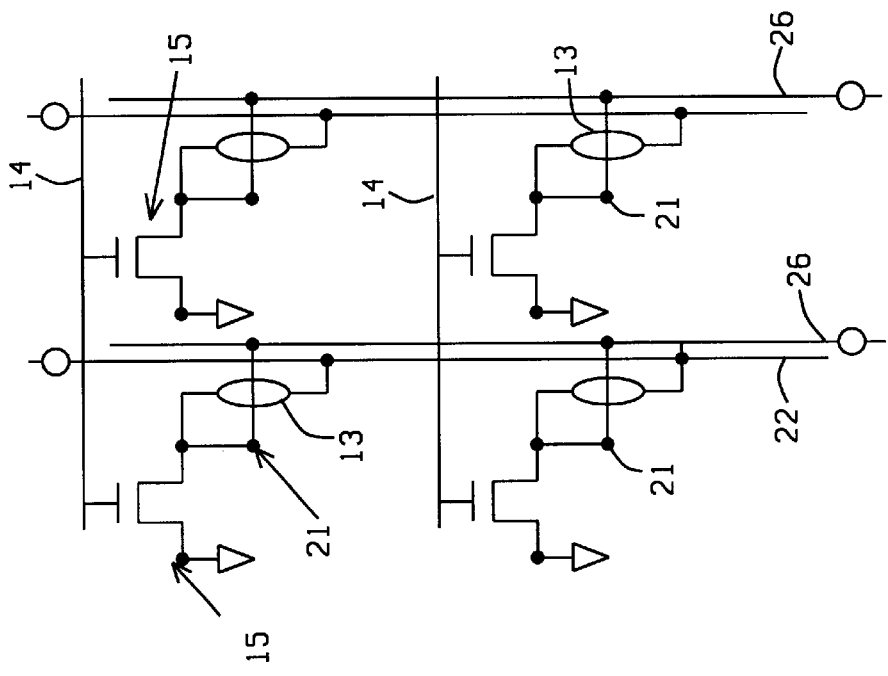
FIG. 2 is a schematic representation of a first embodiment of the present invention showing a 1T1R magnetic RAM.
Figure 1:
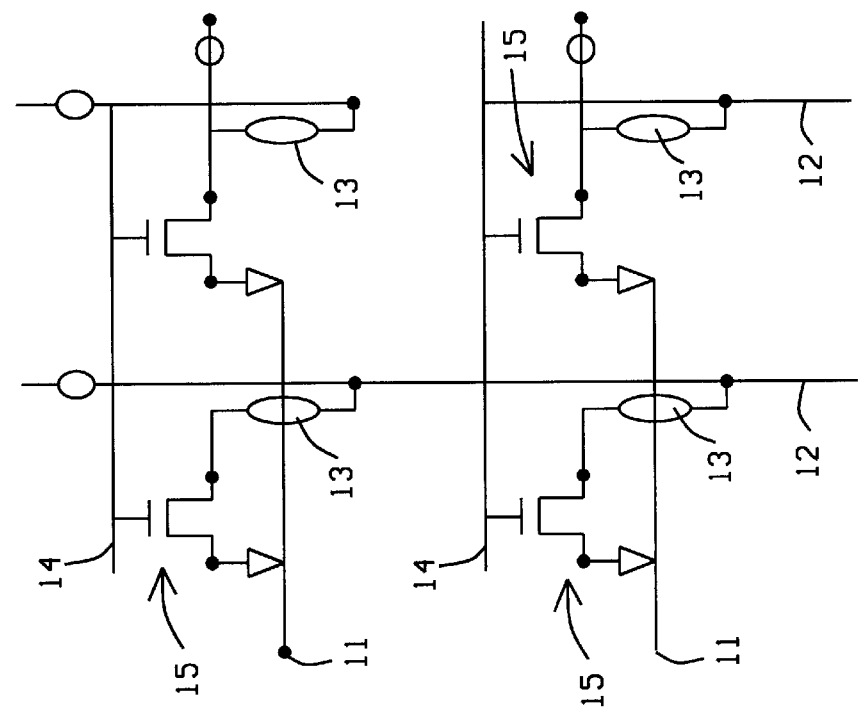
FIG. 1 shows 4 memory cells in a magnetic RAM array of the prior art.

We will describe the present invention through the method used to implement it. In the course of so doing the structure of the present invention will become apparent. Referring now to FIG. 2, the first key feature of the invention is that it uses two parallel bit lines, 22 and 26, instead of the single bit line seen earlier for the prior art. One end of memory cell 13 is connected to first bit line 22, in a similar manner to the prior art but, in another key departure from the prior art, programming line 21 is connected to second bit line 26 instead of extending across the full array. Line 21 may be part of the MR cell, such as the pinned layer of the cell or a combination of the pinned layer, the antiferromagnetic layer, and other metallic layers under it such as the base layer. The write current in those layers generates a magnetic field. Since the free layer is only angstroms away from the current, the magnetic flux generation efficiency of this structure is near maximum. No other structure can match its efficiency. Thus, much less current is required to switch the selected cell. By the same token, the flux seen by neighboring cells is far less, since flux decays inversely with distance. Thus, this write scheme causes less write disturbance to other cells.

Orthogonal to the two bit lines 22 and 26 is word line 14 whose role is to activate/deactivate all transistors whose gates are connected to it (as in the prior art). Also as in the prior art, the drains of FETs 15 are connected to the opposite side of the memory element from the connection to first bit line 22 but, unlike the prior art structure, FETs 15 have their sources connected to ground (instead of to the programming line).

To write a 1 or 0 into memory element 13, its free layer needs to be magnetized in a specific direction. This is achieved by activating FET 15, by application of voltage (or a current source) to word line 14, followed by application of voltage to second bit line 26 so that current will flow through programming line 21. The direction of the programming current determines the cell state. Since this layout ensures that only one memory element has been selected, with no others, particularly neighboring elements, being half selected, the memory elements 13 may be placed very close together without danger of neighbors being disturbed by the act of writing in a value. For a MTJ cell, the stray current in the array is orders of magnitude smaller than the write current.

It is also important to note that, since only a single programming line is needed, it can be placed in direct contact with the memory element. For example, the programming current may flow directly through the pinned layer of a MTJ cell, which is only about 10 angstroms away from the free layer. Thus, the magnetic flux generation efficiency is maximized. When two orthogonal lines are used for programming, they must be separated from one another by a layer of insulation, which is at least 2000 angstroms away from the free layer. Since the magnetic field strength decreases with distance the new cell is far more efficient. This also implies that less current is needed to program the new cell. A calculation indicates that the programming current can be reduced to below 1 mA with the disturb to the neighboring cells due to stray fields being reduced to $\frac{1}{8}$ of what was associated with cells of the prior art.

To interrogate a given memory element, the resistance of element 13 is measured. This is achieved by activating FET 15 through application of voltage to word line 14 followed by application of voltage between first bit line 22 and ground.

Figure 3A:
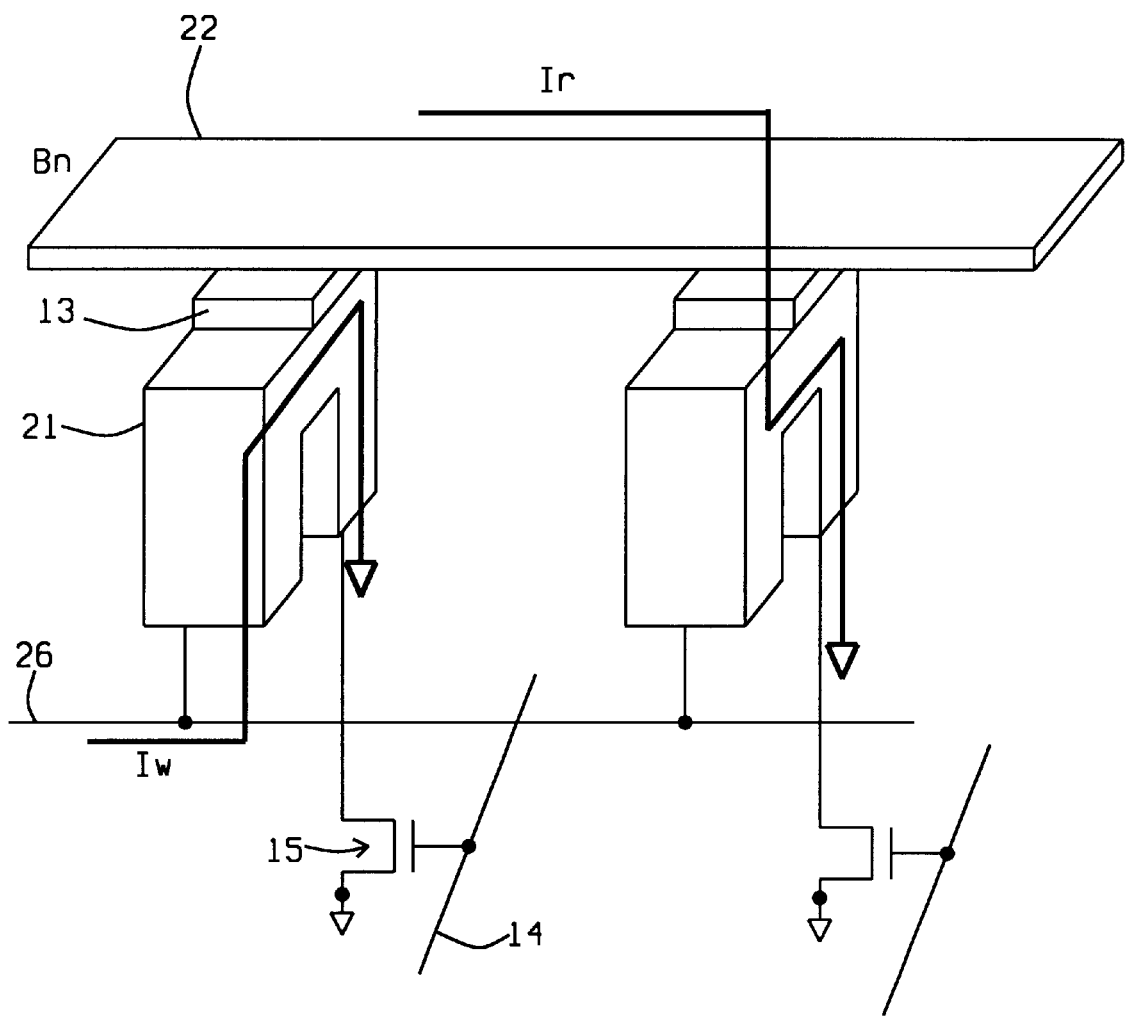
FIGS. 3a and 3b are 3D representations of the schematic shown in FIG. 2 for MTJ and spin valve cells, respectively.
Figure 3B:
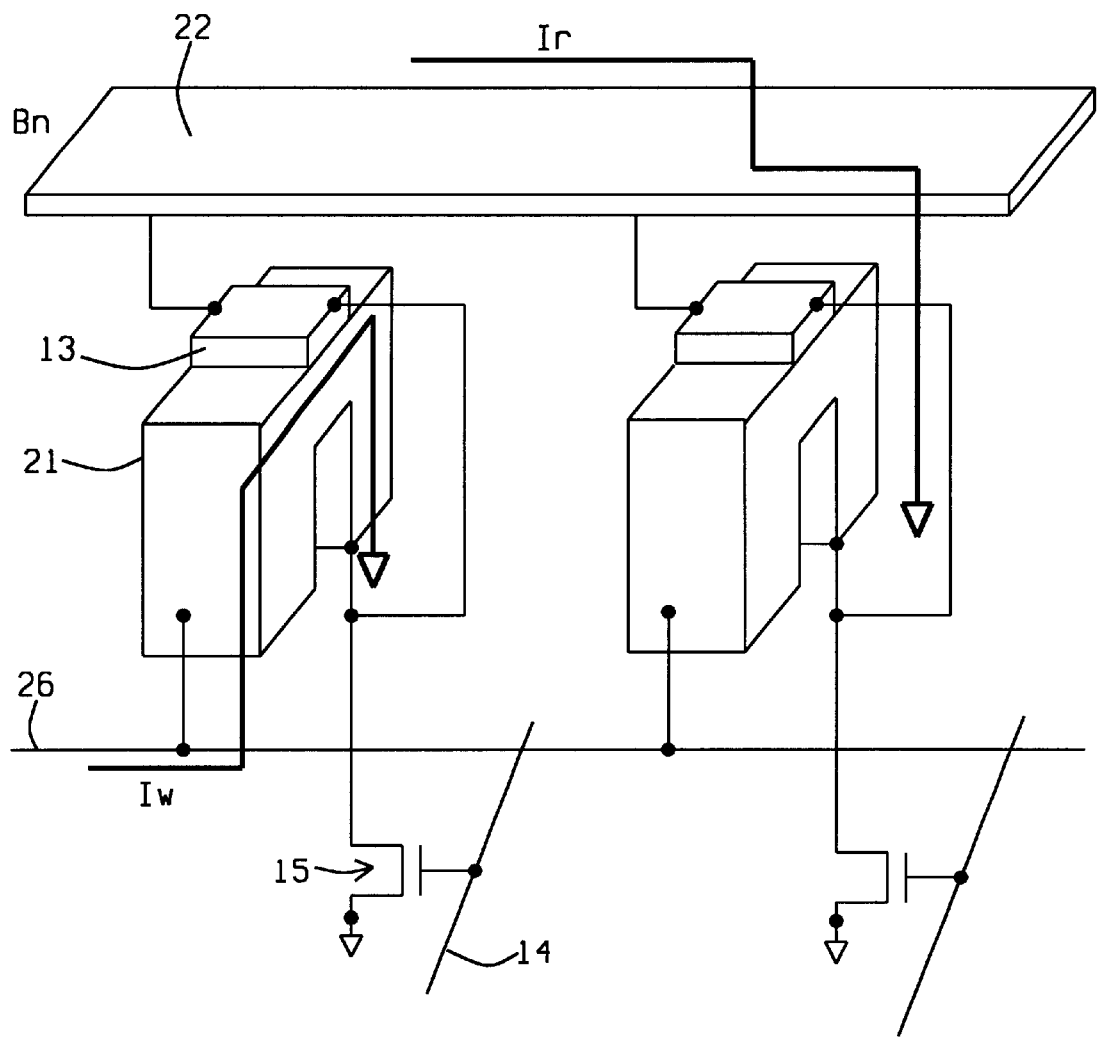

FIGS. 3a and b are three dimensional representations of the schematic circuit of FIG. 2 for the MTJ and spin valves, respectively. Seen there are the paths taken by the write current Iw and read current Ir. The program current is carried by a metal line Bn in the bit line direction. The stray field from the metal cannot switch the cell, since the field is in the direction orthogonal to the switching direction, and the magnitude of the stray field is orders of magnitude smaller than the cell switch field. The programming current is applied to the selected cell through a via and flows into the selected cell. Since the free layer is only few angstroms away from the current path, the magnetic field is big enough to switch the selected cell.

Figure 4:
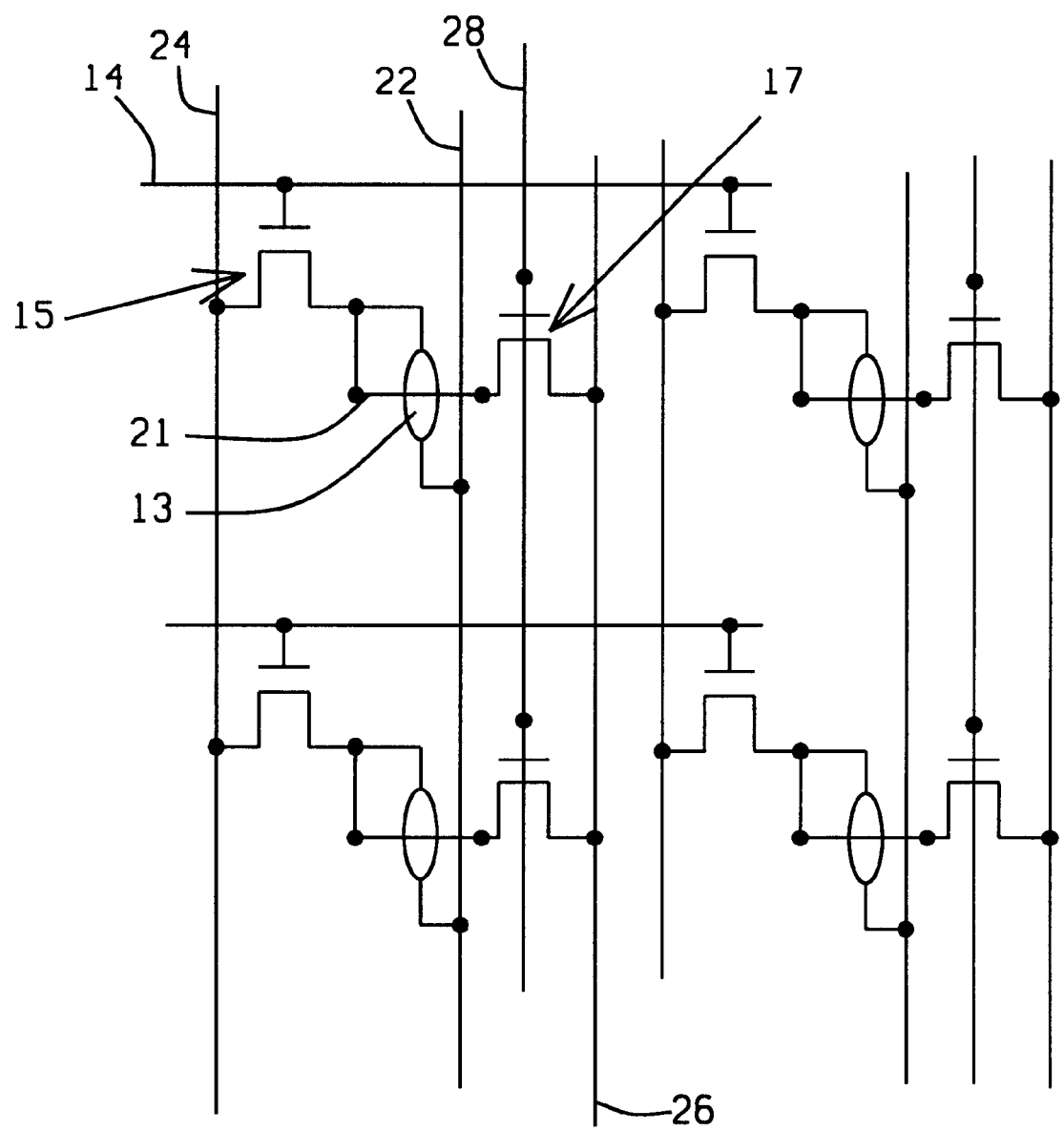
FIG. 4 is a schematic representation of a second embodiment of the present invention showing a 2T1R magnetic RAM.

The present invention may also be implemented in 2T1R version which is shown schematically, in FIG. 4. In this arrangement, one side of the magnetic sandwich is connected to bit line 22, the source of first transistor 15 is connected to data line 24, its gate is connected to word line 14 and its drain connects to one end of the short program line, 21. The source of the second transistor 17 is connected to data line 26, its gate is connected to second bit line 28, and its drain is connected to the other end of short program line 21. Through the word-bit select 14 and 28, both transistors 15 and 17 are 'turned on' and the write current flows from first data line 24 to second data line 26 across 13 through the short line 21.

Figure 5A:
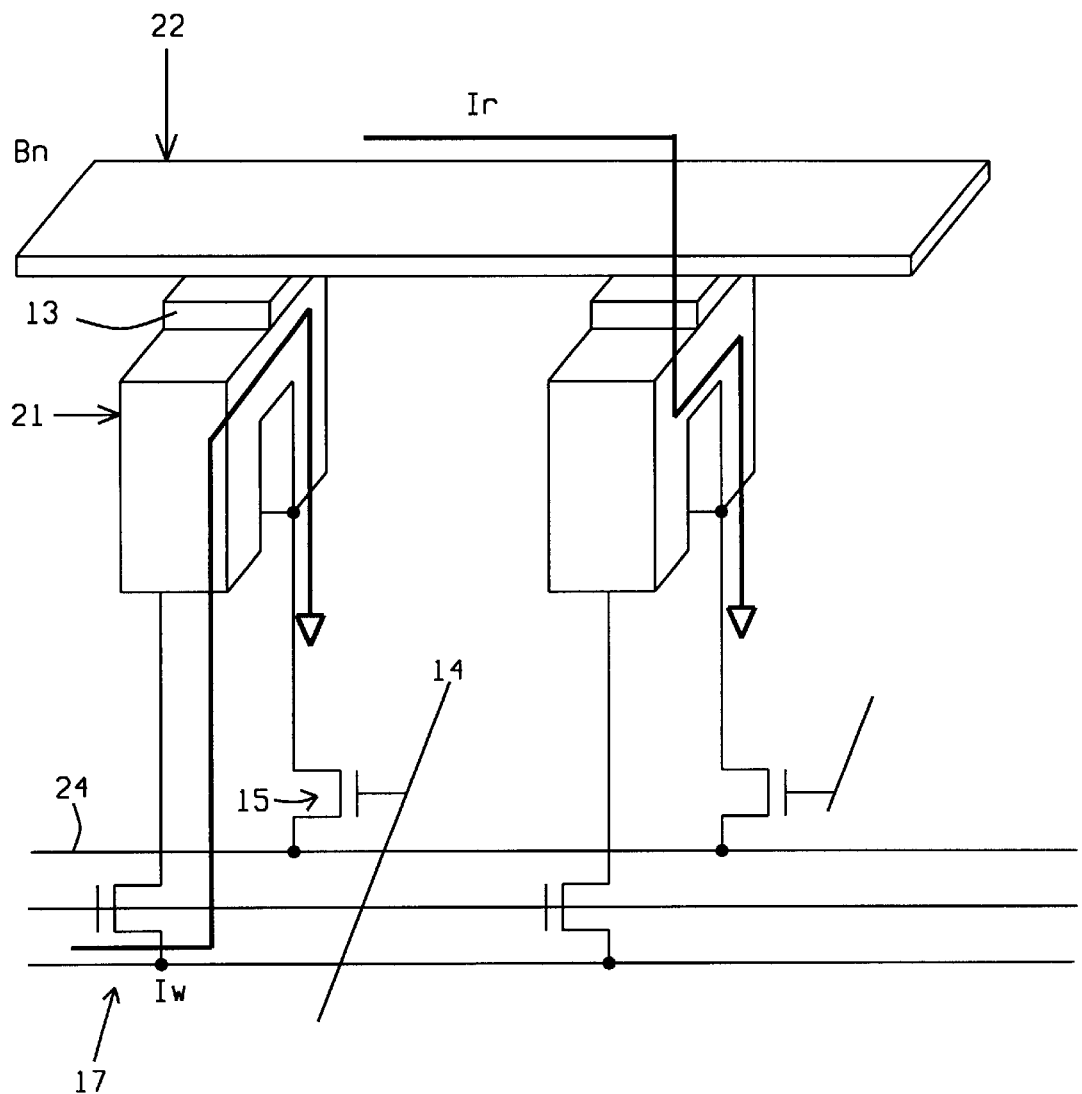

Although the above described 2T1R version of the present invention is more expensive to build than its 1T1R counterpart, its advantage is better control of the write current since there is no stray current in this cell structure. FIGS. 5a and 5b are 3D representations of the schematic shown in FIG. 4 for MTJ and spin valve cells, respectively.

Note that the transistors described above as FETs could also have been replaced by bipolar transistors or other switching devices, including electro-mechanical switches and biological switches.

What is claimed is:

1. A method to store and read data in a memory device, comprising:
   providing a field effect transistor having a gate, a source and a drain;
   providing first and second bit lines that are parallel to one another and a word line that is orthogonal to said first and second bit lines;
   providing a storage element having a magnetization direction, first and second ends as well as a free layer and a pinned layer;
   connecting said source to ground and said gate to said word line;
   connecting said drain to a first end of said storage element through a first connecting line;
   connecting said drain to said second bit line through a second connecting line that passes directly over said storage element;
   connecting a second end of said storage element to said first bit line;
   magnetizing said free layer in a direction by passing a current through said second connecting line;
   applying a voltage between said word line and said first bit line thereby activating said field effect transistor;
   while measuring current flowing through said first bit line, applying a voltage between said second bit line and ground thereby causing a current to flow through said second connecting line; and
   thereby determining the magnetization direction of said free layer.

2. The method described in claim 1 wherein said storage element is a spin valve.

3. The method described in claim 1 wherein said storage element is a pseudo-spin valve.

4. The method described in claim 1 wherein said storage element is a magnetic tunnel junction device that further comprises a base layer and antiferromagnetic layer.

5. The method described in claim 4 wherein said second connecting line includes said pinned layer.

6. The method described in claim 4 wherein said second connecting line includes, said base layer, said pinned layer, and said antiferromagnetic layer.

7. A method to store and read data, comprising:
   providing a first field effect transistor having a first gate, a first source and a first drain;
   providing a second field effect transistor having a second gate, a second source and a second drain;
   providing first and second bit lines that are parallel to one another, first and second data lines that are parallel to said bit lines and a word line that is orthogonal to said bit lines;
   providing a storage element having a magnetization direction, first and second ends as well as a free layer and a pinned layer;
   providing a program line, having first and second ends, that crosses said storage element;
   connecting said first source to said first data line, said first gate to said word line, and said first drain to said first end of said storage element;
   further connecting said first drain to said first end of said program line;
   connecting said second end of said program line to said second drain;
   connecting said second end of said storage element to said first bit line;
   connecting said second source to said second data line;
   connecting said second gate to said second bit line;
   activating said word line and said second bit line, thereby turning on both field effect transistors, and passing a current from said first data line to said second data line through said program line whereby said free layer is magnetized in a direction;
   applying a voltage between said first data line and said first bit line causing a current to flow through said first bit line; and
   by measuring said current flowing through said first bit line, determining the magnetization direction of said free layer.

8. The method described in claim 7 wherein said storage element is a spin valve.

9. The method described in claim 7 wherein said storage element is a pseudo-spin valve.

10. The method described in claim 7 wherein said storage element is a magnetic tunneling junction device.

11. The method described in claim 10 wherein said program line further comprises said pinned layer.

12. The method described in claim 10 wherein said program line further comprises, said pinned layer, said antiferromagnetic layer, and said base layer.

13. A memory device, comprising:
   a field effect transistor having a gate, a source and a drain;
   first and second bit lines that are parallel to one another and a word line that is orthogonal to said first and second bit lines;
   a storage element having first and second ends as well as a free layer, a longitudinal axis, and a pinned layer;
   said source being connected to ground and said gate to said word line;
   said drain being connected to a first end of said storage element through a first connecting line;
   said drain being connected to said second bit line through a second connecting line that passes directly over, and is in contact with, the longitudinal axis of said storage element in a direction that is independent of how said second connecting line is oriented; and
   a second end of said storage element being connected to said first bit line.

14. The memory device described in claim 13 wherein said storage element is a spin valve.

15. The memory device described in claim 13 wherein said storage element is a pseudo-spin valve.

16. The memory device described in claim 13 wherein said storage element is a magnetic tunnel junction device.

17. The memory device described in claim 13 wherein said transistor is an NMOS device.

18. The memory device described in claim 13 wherein said transistor is an PMOS device.

19. The memory device described in claim 13 wherein said field effect transistor is replaced by a bipolar transistor, an electro-mechanical switch, or a biological switch.

20. A memory device, comprising:
a magnetic storage element having first and second ends as well as a free layer and a pinned layer;
a first field effect transistor having a first gate, a first source and a first drain;
a second field effect transistor having a second gate, a second source and a second drain;
first and second bit lines, that are parallel to one another, and first and second data line that are parallel to said bit lines, and a word line that is orthogonal to said bit lines;
a program line, having first and second ends, that crosses said storage element; said first source being connecting to said first data line, said first gate to said word line, and said first drain to said first end of said storage element;
said first drain being further connected to said first end of said program line;
said second end of said program line being connected to said second drain;
said second end of said storage element being connected to said first bit line;
said second source connected to said second data line; and
said second gate being connected to said second bit line.

21. The memory device described in claim 20 wherein said magnetic storage element is a spin valve.

22. The memory device described in claim 20 wherein said magnetic storage element is a pseudo-spin valve.

23. The memory device described in claim 20 wherein said storage element is a magnetic tunnel junction device that further comprises a base layer and an antiferromagnetic layer.

24. The memory device described in claim 23 wherein said second connecting line further comprises said pinned layer.

25. The memory device described in claim 23 wherein said program line further comprises, said base layer, said pinned layer, and said anti-ferromagnetic layer.

26. The memory device described in claim 20 wherein said transistor is an NMOS device.

27. The memory device described in claim 20 wherein said transistor is a PMOS device.

28. The memory device described in claim 20 wherein said first transistor is an NMOS device and said second transistor is a PMOS device.

29. The memory device described in claim 20 wherein said first transistor is a PMOS device and said second transistor is an NMOS device.

30. The memory device described in claim 20 wherein a field effect transistor is replaced by a bipolar transistor, an electro-mechanical switch, or a biological switch.

* * * * *